(12) United States Patent
Bolz et al.

(10) Patent No.: US 6,919,651 B2
(45) Date of Patent: Jul. 19, 2005

(54) CIRCUIT ARRANGEMENT FOR HIGH-SPEED SWITCHING OF INDUCTIVE LOADS

(75) Inventors: Stephan Bolz, Pfatter (DE); Günter Lugert, Regensburg (DE); Gerhard Göser, Pentling (DE)

(73) Assignee: Siemens Aktiengesellschaft, Munich (DE)

( * ) Notice: Subject to any disclaimer, the term of this patent is extended or adjusted under 35 U.S.C. 154(b) by 161 days.

(21) Appl. No.: 10/304,286

(22) Filed: Nov. 26, 2002

(65) Prior Publication Data

US 2004/0100150 A1 May 27, 2004

(51) Int. Cl.[7] .............................................. H01F 27/42
(52) U.S. Cl. ...................... 307/104; 307/141; 327/110; 327/139
(58) Field of Search ................................ 327/110, 139; 307/104

(56) References Cited

U.S. PATENT DOCUMENTS

| | | | | |
|---|---|---|---|---|
| 3,571,614 A | * | 3/1971 | Rolstead | 361/13 |
| 3,763,418 A | * | 10/1973 | Beck et al. | 363/124 |
| 4,700,891 A | * | 10/1987 | Hans et al. | 239/132.5 |
| 5,065,045 A | * | 11/1991 | Mok | 327/63 |
| 5,752,482 A | * | 5/1998 | Roettgen et al. | 123/322 |
| 5,936,439 A | * | 8/1999 | Pollersbeck | 327/110 |
| 6,181,171 B1 | * | 1/2001 | Graf et al. | 327/110 |
| 6,351,162 B1 | * | 2/2002 | Schwartz | 327/110 |

FOREIGN PATENT DOCUMENTS

| | | | |
|---|---|---|---|
| DE | 2446193 | 7/1977 | G01D/5/244 |
| DE | 3543058 | 6/1987 | G01P/3/48 |
| DE | 4300882 A1 | 7/1994 | H02H/9/04 |
| DE | 4207371 | 8/1995 | G01P/3/48 |
| DE | 19609121 | 2/1997 | H03K/17/687 |
| DE | 19707263 | 8/1998 | G01D/18/00 |
| DE | 19751651 | 2/1999 | H03K/17/082 |
| DE | 19924113 | 4/2000 | G01D/5/244 |
| DE | 10030485 | 1/2001 | G01P/3/488 |
| EP | 0330823 | 1/1989 | H03K/17/687 |
| EP | 0415081 | 7/1990 | H03K/17/06 |
| EP | 0574646 | 6/1992 | H03K/17/06 |
| EP | 0684699 | 5/1994 | H03G/1/00 |
| EP | 0973258 | 1/2000 | H03K/3/0233 |
| WO | 91/16765 | 10/1991 | H03K/17/08 |

* cited by examiner

Primary Examiner—Robert L. Deberadinis
(74) Attorney, Agent, or Firm—Baker Botts L.L.P.

(57) ABSTRACT

A circuit arrangement for switching an inductive load (12, 12a–d) with connections to a power supply source (11, 11', 11") by means of which an exciter voltage can be applied to the inductive load (12, 12a–d) in a switched-on state is described, comprising switching means by means of which, depending on a control signal, a power circuit comprising the inductive load (12, 12a–d) and the power supply source connections, can be closed when switched from the switched-off to the switched-on state and opened when switched from the switched-on to the switched-off state, furthermore comprising a first diode (15, 15a–d, 15a'–c', 15a"–c") arranged in parallel with the inductive load (12, 12a–d) and so as to block in the switched-on state. This present invention is characterized in that an additional commutation inductance (18) is provided which is arranged in parallel with the inductive load (12, 12a–d) and in series with the first diode (15, 15a–d, 15a'–c', 15a"–c").

20 Claims, 5 Drawing Sheets

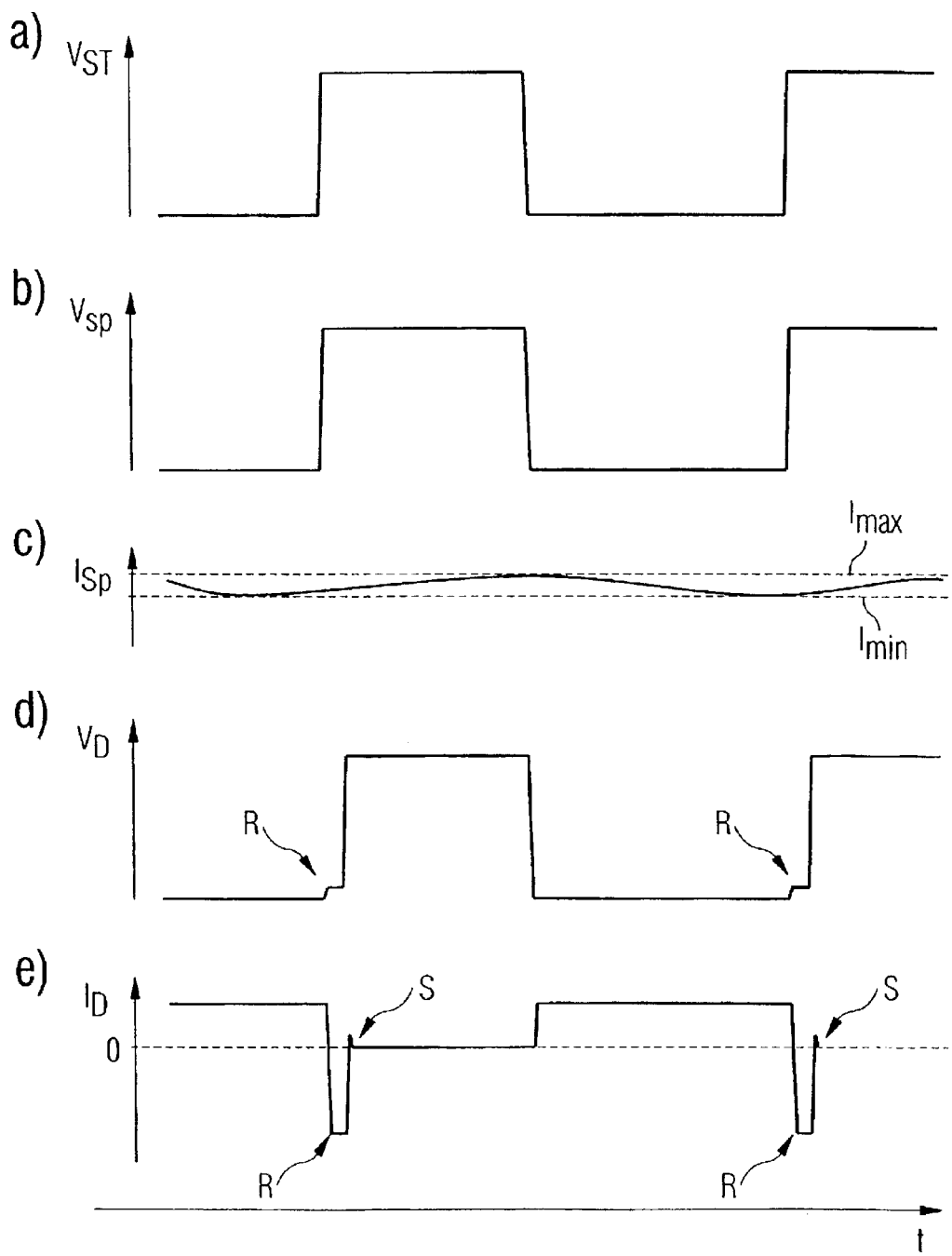

CIRCUIT ARRANGEMENT FOR HIGH-SPEED SWITCHING OF INDUCTIVE LOADS

BACKGROUND OF THE INVENTION

This present invention refers to a circuit arrangement for switching an inductive load with connections to a power supply source by means of which an exciter voltage can be applied to the inductive load in a switched-on state, comprising switching means by means of which, depending on a control signal, a power circuit comprising the inductive load and the power supply source connections can be opened when switched from the switched-off state to the switched-on state and can be closed when switched from the switched-on state to the switched-off state as well as furthermore comprising a first diode which is connected in parallel with the inductive load and arranged so as to block in the switched-on state.

Such circuits are frequently used wherever rapid mechanical movements are electrically controlled, e.g. in magnetic valves, in particular magnetic injection valves in combustion engines. In this case, the inductive load is e.g. an electromagnet coil. Once a voltage U is applied, as a result of which a coil current I flows through the coil, a magnetic field which is proportional to the coil current builds up, and by means of such magnetic field, a valve element is inserted into or retracted from a fuel channel. The law of induction $$U = L\frac{dI}{dt},$$

known from prior art, where L represents the inductance of the coil, shows that build-up of the magnetic field and, consequently, mechanical actuation can be expedited by increasing the voltage that is applied. High voltage, however, leads to a correspondingly high coil current, which is usually not desired. As a matter of fact, the coil current should be limited to a value that is sufficient to trigger mechanical actuation, i.e. the so-called "breakaway starting current". The ohmic resistance of the coil is usually not sufficient to effectively limit the coil current.

To resolve this problem, it is known from prior art to temporarily disconnect the inductive load from the power supply source as soon as a permissible maximum value of the coil current is exceeded, in order to allow the coil current to decrease and reestablish the connection later as soon as the coil current drops below a lower threshold value, in order to allow the coil current to build up again. To keep the coil current at a constant average value (within certain limits) by periodically turning the exciter voltage on and off, the coil current must not drop off too quickly during the switch-off phases. This is achieved by arranging, in parallel with the inductive load, a freewheeling diode (first diode), in such a manner against ground that exciter voltage is applied to such freewheeling diode as soon as the exciter voltage is turned on. Once the exciter voltage is turned off, the coil is short-circuited via these diode. In the coil, the decreasing coil current induces a voltage which flows in the same direction as the exciter voltage which attempts to maintain the coil current. Now, the coil current travels via the diode, which does not offer any significant ohmic resistance, as a result of which the coil current can be maintained for a comparatively long period of time. FIG. 5 shows a replacement circuit diagram of such a type of a state-of-the-art circuit wherein the exciter voltage is turned on and off by means of a switching transistor in the form of a self-blocking MOS-FET which is controlled by an electrical control voltage as a control signal. FIGS. 7a–c shows the corresponding idealized graph of the control signal, the coil voltage, and the coil current. For a more detailed description of the Figures, see the particular description.

One drawback of such state-of-the-art circuits becomes apparent as soon as the coil is reconnected with the exciter voltage. At this point in time, the coil current travels via the freewheeling diode and must now be transferred to the switch. Technically available power-barrier diodes—in particular silicon diodes—block in a time-delayed manner in the event that, prior thereto, a voltage has been applied to them in the forward direction. This time delay, which depends on current intensity and the diode type, is known by the term "reverse recovery time" or "blocking delay time" and can range between 10 ns and several 100 ns. During this period, the diode is conductive. In case the switching transistor is turned on faster than the blocking delay time, this causes a temporary leakage current from the power supply source via the switching transistor and the freewheeling diode to the ground. Under unfavorable circumstances, this so-called "reverse current peak" can reach several times the coil current, which entails significant losses. Furthermore, the build-up of the exciter voltage at the output of the transistor is delayed by this "short-circuit".

In addition, the reverse current drops off abruptly at the end of the blocking delay time, as a result of which over time, a high change in current occurs (often >1 A/ns), which excites all resonance-capable structures that are connected, such as supply inductances, parasitic capacitances, etc. This produces a negative impact on the switching operation, in particular on the "cleanness" of the switching edge, and leads to a broadband, conductor-bound, electromagnetic emission.

The so-called "soft recovery" diodes known from prior art which would resolve the issue of the significant change in current upon conclusion of the blocking delay time are unsuitable for high-speed switching operations due to their very long blocking delay times.

Attempts have therefore been made to suppress the resulting resonances by installing a low-pass filter comprising a filter inductance connected in series with the load inductance and a filter capacitance connected in parallel therewith. Such a circuit, which will be discussed in more detail in the specific description, is shown in FIG. 6. In particular in circuits with several inductive loads, as are commonly used to control valves in combustion engines, however, construction becomes very complicated and costly. In addition, the issue of the reverse current peak per se is not resolved.

SUMMARY OF THE INVENTION

The object of this present invention is therefore to provide a circuit arrangement which overcomes the above-mentioned drawbacks of state-of-the-art circuits and, in particular, offers a simple and cost-effective solution to reliably prevent or at least effectively limit the reverse current peak.

This object is achieved by a circuit arrangement for switching an inductive load, comprising connections to a power supply source by means of which an exciter voltage can be applied to the inductive load, in a switched-on state, switching means by means of which, depending on a control signal, a power circuit comprising the inductive load and the power supply source connections can be closed when switched from the switched-off to the switched-on state and opened when switched from the switched-on to the switched-off state, and a first diode connected in parallel with the inductive load and arranged so as to block in the switched-on state, wherein an additional commutation inductance is provided which is arranged in parallel with the inductive load and in series with the first diode.

According to one embodiment, the present invention is directed to a method for switching an inductive load, comprises the steps of:

providing an exciter voltage that can be applied to the inductive load, in a switched-on state, switching, depending on a control signal, a power circuit comprising the inductive load and the power supply source connections into either a switched-on state or a switched-off state, a first diode connecting a first diode in parallel with the inductive load and arranging it so as to block in the switched-on state, and providing an additional commutation inductance which is arranged in parallel with the inductive load and in series with the first diode.

Several inductive loads that are connected in series can be provided with individual associated switching means and individual associated first diodes, and a commutation inductance can be provided which is connected in parallel with the inductive loads and in series with the first diodes that are connected with each other in parallel. A second diode can be provided which is connected in parallel with the commutation inductance and arranged so as to block in the switched-on state. The commutation inductance or the network comprising a commutation inductance and second diode can be provided on the ground side of the switching means. The commutation inductance or the network comprising a commutation inductance and a second diode can be provided on the supply voltage-side of the switching means. Two commutation inductances or two networks comprising a commutation inductance and a second diode may be provided, one of which is arranged on the ground side and the other on the supply voltage-side of the switching means. The switching means can be provided in the form of a switching transistor to which a control power source can apply a control voltage as a control signal. The switching transistor can be a self-blocking MOS-FET. For switching several inductive loads, several switching transistors can be provided which are controlled by a joint control power source whose signal is distributed to several switching transistors by means of demultiplexing. The inductive loads can be magnetic injection valves in a motor vehicle.

This present invention modifies the type of circuit arrangement shown in FIG. 5 in that an additional commutation inductance is provided which is arranged in parallel with the inductive load and in series with the first diode, i.e. the freewheeling diode.

Since the current cannot abruptly change because of the inductance, for a short period of time (t<<L/R), such inductance acts like a power source in the direction opposite the change in current. As a result, the reverse current peak is compensated, i.e. to a larger degree as the change steepens, which particularly supports the switching operations which are of prime interest for the purposes of this present invention. Once the supply voltage is turned on again, this permits a controlled decrease in freewheeling diode current during the blocking delay time and simultaneously the free build-up of exciter voltage at the output of the switched-on transistor, depending on the control characteristics of the latter. By preventing or significantly reducing, respectively, the basic problem related with the reverse current peak, the circuit in accordance with this present invention offers the following advantages: firstly, reverse peak-related losses are prevented; secondly, the build-up of exciter voltage and, consequently, the switching edge occurs in a cleaner and more expedient manner, which leads to more accurate and quicker switching operations, and thirdly, the resonant excitation of other components and, therefore, undesired electromagnetic emission is avoided in a constructively simply and inexpensive manner.

This present invention is not limited to circuits for high-speed switching of a single inductive load. While it is possible to implement the arrangement in accordance with this present invention separately for each inductive load, it may be more advantageous to provide several inductive loads connected in parallel, each with associated switching means and associated first diodes, wherein a commutation inductance is provided which is connected in parallel with the inductive loads and in series with the first diodes that are connected in parallel with each other. In particular, this is possible in case where overlapping of the control phases can be excluded, as is the case, for example, when several injection valves are controlled in combustion engines. In the process, the circuit should be rearranged in such a manner that the commutation inductance is positioned on the side facing away from the switching means of the freewheeling diodes that are connected in parallel. This rearrangement does not adversely impact the performance of the circuit in accordance with this present invention. This refinement is advantageous insofar as construction is simplified and space requirements are reduced in comparison with a circuit comprising several partial circuits whose individual reverse current peaks are suppressed by means of individual commutation inductances.

Although the circuit arrangement in accordance with this present invention for one or several inductive loads to be switched solves the aforementioned problems of state-of-the-art circuits as soon as the exciter voltage is switched on again, problems can occur once the exciter voltage is turned off again. Once the blocking delay of the freewheeling diode is over, the commutation inductance is unpowered. In this case, once the inductive load is again disconnected from the exciter voltage, the coil current must be transferred to the freewheeling diode. However, this first requires build-up of the coil current in the commutation inductance, which, like in the case of reconnecting, as described above, may cause a negative voltage peak. For that reason, in a particularly preferred embodiment hereof, a second diode is provided which is connected in parallel with the commutation inductance and arranged so as to block in the switched-on state. The system comprising the commutation inductance and the second diode connected thereto in parallel, which shall hereinafter be referred to as the network, makes it possible to reliably prevent the above-mentioned negative voltage peak.

For the build-up of a step-down switching regulator, it is advantageous to provide the commutation inductance or the network comprising the commutation inductance and the second diode on the ground side of the switching means. This arrangement can also be implemented in multiphase regulators.

In step-up regulators, however, the commutation inductance or the network comprising the commutation inductance and the second diode is preferably arranged on the supply voltage-side of the switching means. This arrangement can also be implemented in multiphase regulators.

Finally, it is also possible to apply the benefits of this present invention in single-phase or multiphase, bidirectional step-up/step-down regulators. For that purpose, it is preferred to provide two commutation inductances or two networks comprising a commutation inductance and a second diode, one of them positioned on the ground side and the other on the supply voltage-side of the switching means.

As a basic principle, it is possible to implement the switching means comprising the power circuit, which comprises the inductive load to be switched and the power supply source and/or corresponding connections, respectively, in many different ways. It is particularly advantageous, however, to provide the switching means in the form of a switching transistor to which a control power source can apply a control voltage as a control signal. It is particularly preferred to provide, for each inductive load to be switched, a separate switching transistor associated therewith.

Those in the art are certainly familiar with a number of different embodiments of switching transistors whose basic characteristics make them suitable for use in a circuit in accordance with this present invention. Because of its special properties, however, a self-blocking MOS-FET (metal/oxide/semiconductor field effect transistor) has been found to be particularly advantageous for use as a switching transistor.

BRIEF DESCRIPTION OF THE DRAWINGS

This present invention shall be further explained below with reference to the enclosed drawings by described a number of exemplary preferred embodiments hereof.

FIG. 7 is a schematic representation of a) the control voltage, b) the coil voltage, c) the coil current, d) the diode voltage, and e) the diode current in a circuit in accordance with FIG. 5.

DETAILED DESCRIPTION OF THE PREFERRED EMBODIMENTS

Figure 5:
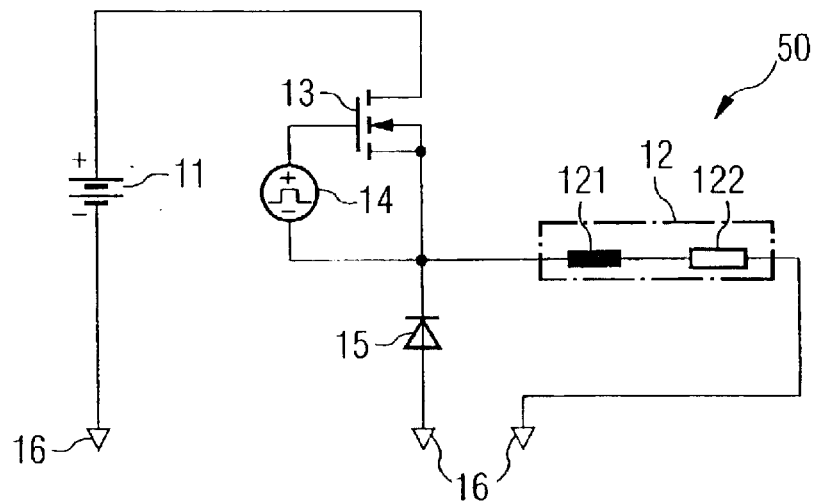
FIG. 5 shows a state-of-the-art circuit arrangement.

FIG. 5 represents a prior-art basic circuit 50 for high-speed switching of an inductive load 12. FIG. 7 is a schematic representation of the signals occurring in the circuit. To the inductive load 12, which is shown as a combination of the actual inductance 121 and the ohmic resistance 122 of the coil winding of a magnetic valve, in the turned-on state, an exciter voltage is supposed to be applied by a power supply source 11. To ensure the fastest possible switching operation at a specific inductance 121, a comparatively high exciter voltage is selected. In this present context, this means an exciter voltage which is at least high enough so that the coil resistance 122 is not sufficient to effectively limit the current $I_{SP}$ (FIG. 7c) through the coil 12 to a desired value. It is therefore necessary to otherwise limit the coil current $I_{SP}$ during the activation phase of the magnetic valve. For that purpose, the switching transistor 13, which closes the power circuit comprising the coil 12 and the power supply source 11, is periodically switched, i.e. the coil 12 is periodically disconnected from and reconnected with the exciter voltage. The switching transistor 13 is controlled by a control power source 14 via a control voltage $V_{ST}$ (FIG. 7a). The resulting voltage $V_{SP}$ via the coil 12 is shown in a schematic representation in FIG. 7b. To ensure that the current $I_{SP}$ does not drop off too quickly after disconnecting, in parallel with the coil 12, a freewheeling diode 15 is provided which is arranged such as to block in the switched-on state. In the switched-off state, i.e. when the coil 12 and the power supply source are disconnected from each other, the coil current $I_{SP}$ is maintained by the inductance 121 and flows via the freewheeling diode 15 in the forward direction. The resistance of the freewheeling diode 15 is sufficiently low to ensure a long drop-off time of the coil current (proportional to L/R, where L represents inductance and R the ohmic resistance of the system). By selecting a suitable control signal $V_{ST}$, a coil current $I_{SP}$ can be maintained which only varies between a maximum value $I_{max}$ and a minimum value $I_{min}$. In the embodiment shown, the negative poles of the circuit are kept in contact with the ground 16.

As already explained above, because of the blocking delay of the diode 15, the prior-art circuit is disadvantageous insofar as a reverse current peak occurs as soon as the transistor is turned again, i.e. once the exciter voltage is reapplied, with the resulting negative consequences. FIGS. 7d and 7e, which show the voltage $V_D$ resp. the current $I_D$ via resp. through the freewheeling diode 15, the reverse current peaks are identified by the arrows R. In addition to the losses and increased stress on the components, the vibrations S at the abrupt end of the blocking delay time, as a result of which other components become subject to broadband vibration and electromagnetic emission, is a particular disadvantage caused by the reverse current peak.

Figure 6:
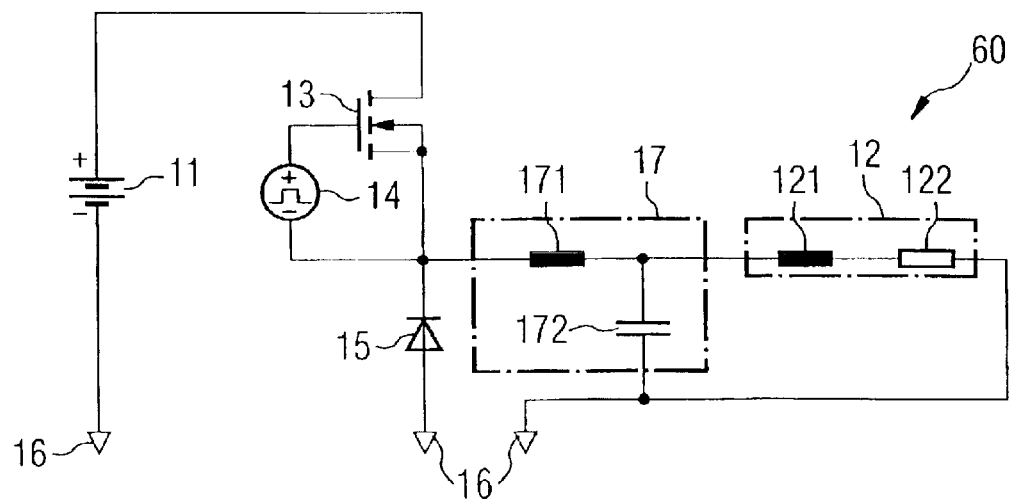
FIG. 6 shows a circuit arrangement wherein, compared to the basic arrangement depicted in FIG. 5, a low-pass filter has been added.

FIG. 6 shows a circuit arrangement 60 wherein, a low-pass filter 17 has been added to the circuit 50 shown in FIG. 5 which comprises a filter inductance 171 connected in series with the coil 12 and a filter capacitance 172 connected thereto in parallel. The other components are identical to those shown in FIG. 5 and are identified by the same reference numbers. Although the use of the low-pass filter 17 makes it possible to suppress the vibration S, the other negative consequences caused by the reverse current peak remain unresolved.

Figure 1:
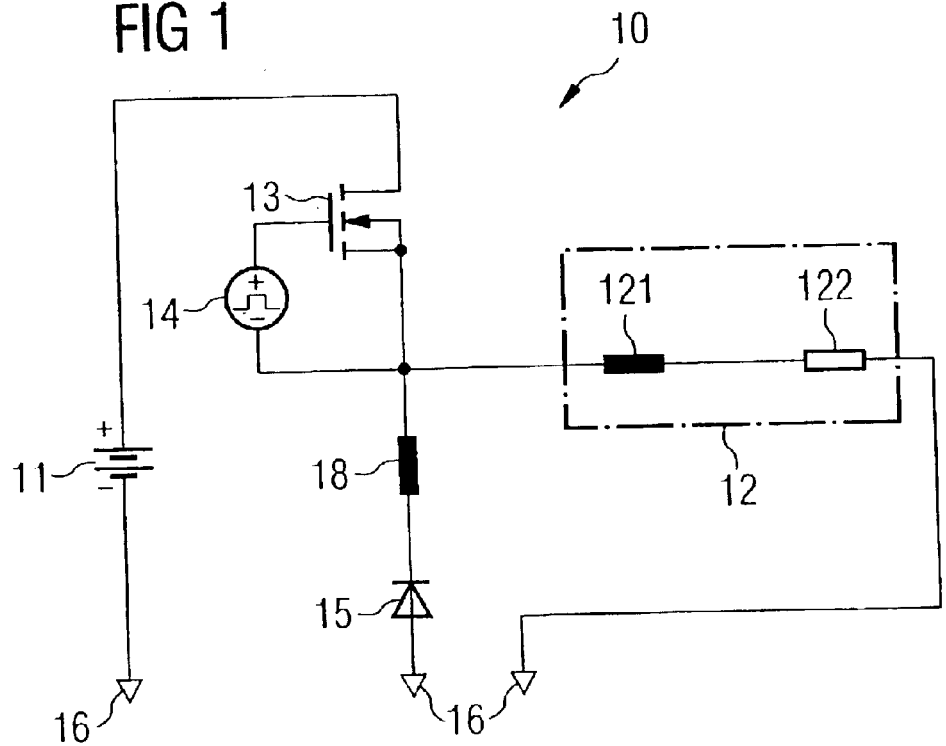
FIG. 1 shows a circuit arrangement in accordance with this present invention in a first embodiment of this present invention.

FIG. 1 shows a basic circuit in accordance with this present invention 10 in which this issue is successfully resolved. To the prior-art circuit 50 (FIG. 5), a commutation inductance 18 which is connected in series with the freewheeling diode 15 and, like the latter, connected in parallel with the coil 12 is added. The other components are identical to those shown in FIG. 5 and are identified by the same reference numbers. The commutation inductance 18 counteracts the reverse current peak and therefore "bridges" the blocking delay time of the freewheeling diode 15, as soon as the transistor 13 is turned on again, as a result of which the coil current can be transferred to the transistor 13 while eliminating the above-described drawbacks of the freewheeling diode 15.

Figure 2:
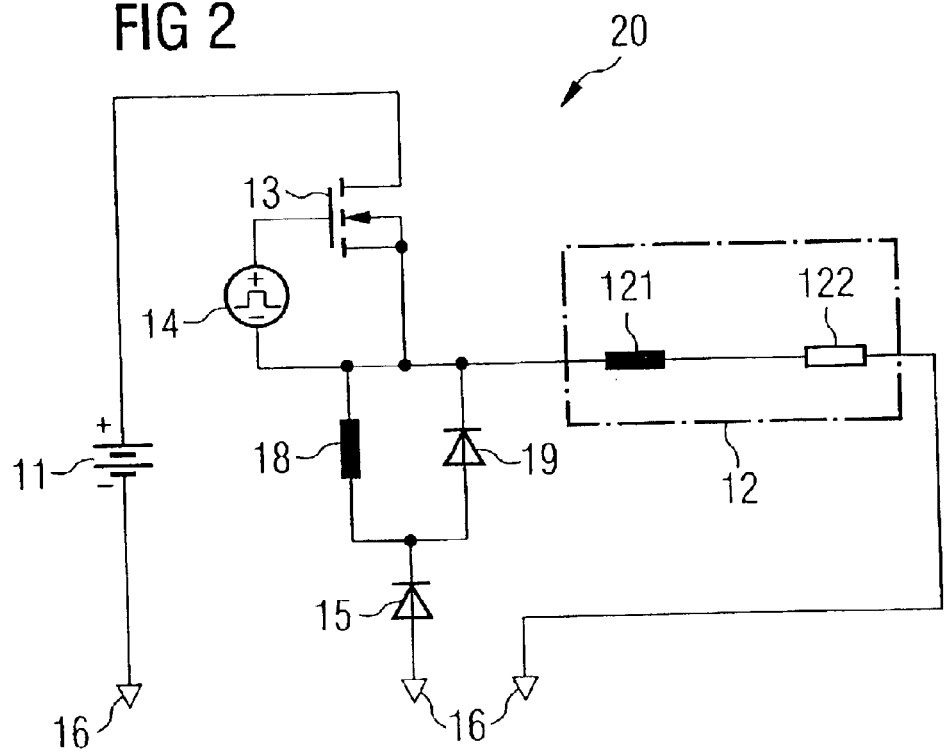
FIG. 2 shows a circuit arrangement in accordance with this present invention in a second embodiment of this present invention.

At the end of the blocking delay of the freewheeling diode 15, the commutation inductance 18 becomes unpowered. As explained above, once the coil 12 is disconnected from the exciter voltage again, this may lead to an undesired negative voltage peak. In accordance with this present invention, this can be corrected by adding a second diode 19 to the circuit 10 and connecting such diode in parallel with the commutation inductance 18 and, like the latter, in series with the freewheeling diode 15, as shown in FIG. 2 for the circuit 20. The other components are identical to those shown in FIG. 1 and are identified by the same reference numbers.

Figure 3:
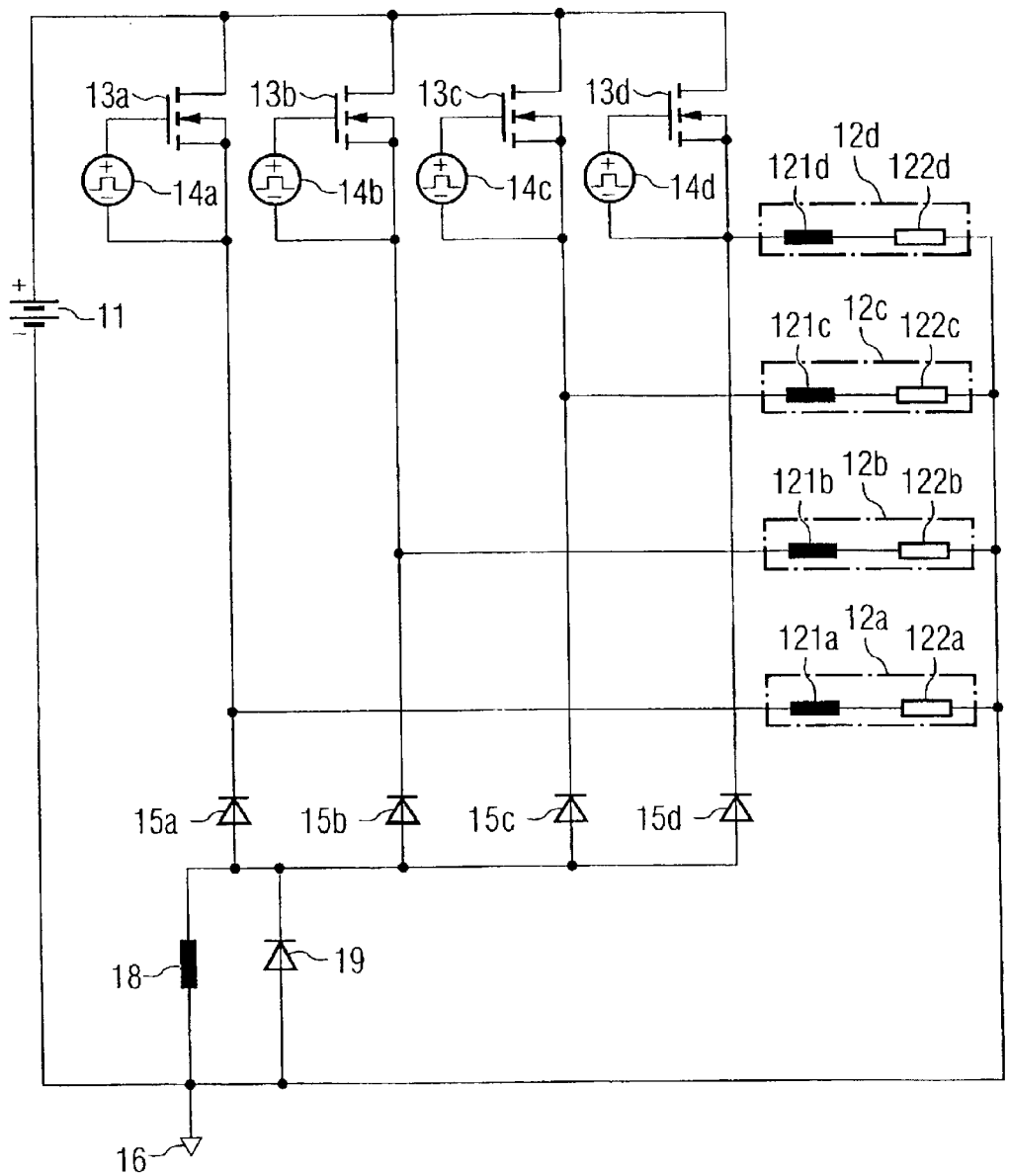
FIG. 3 shows a circuit arrangement in accordance with this present invention wherein, compared to the basic arrangement depicted in FIG. 2, several outputs have been added.

FIG. 3 shows a circuit 30 which combines several basic circuits 20 in accordance with FIG. 2 whose respective components are identified by the additional letters a–d, thereby expanding the basic circuit 20 to several inductive loads 12*a–d* which can control one and the same circuit. This common arrangement is used, for example, to control several valves in a combustion engine. For that purpose, each coil 12*a*–12*d* is provided with its own switch, in this present embodiment a switching transistor 13*a–d*, and its own control system. Likewise, each partial circuit is provided with its own freewheeling diode 15*a–d*. Of course, instead of separate control power sources 14*a–d*, as in the depicted embodiment, a single control power source can also be used, and its signal can be distributed by means of suitable demultiplexing to the transistors 13*a–d*. In accordance with this present invention, however, an individual commutation inductance or, as in the embodiment shown, a separate network comprising a commutation inductance and a second diode for each individual partial circuit a–d is not required. As a matter of fact, it is possible to only provide a single commutation inductance 18 resp. a single network comprising a commutation inductance 18 and a second diode 19 for several partial circuits a–d. The corresponding rearrangement of the circuit between the freewheeling diodes 15*a–d* and the commutation inductance 18/second diode 19 functions in the same manner as the basic circuit in accordance with this present invention. Such an arrangement only requires that the control phases of the individual coils do not overlap. All other components are identical to those shown in FIGS. 1 and 2 and are identified by the same reference numbers, if necessary with including letters a–d.

Figure 4:
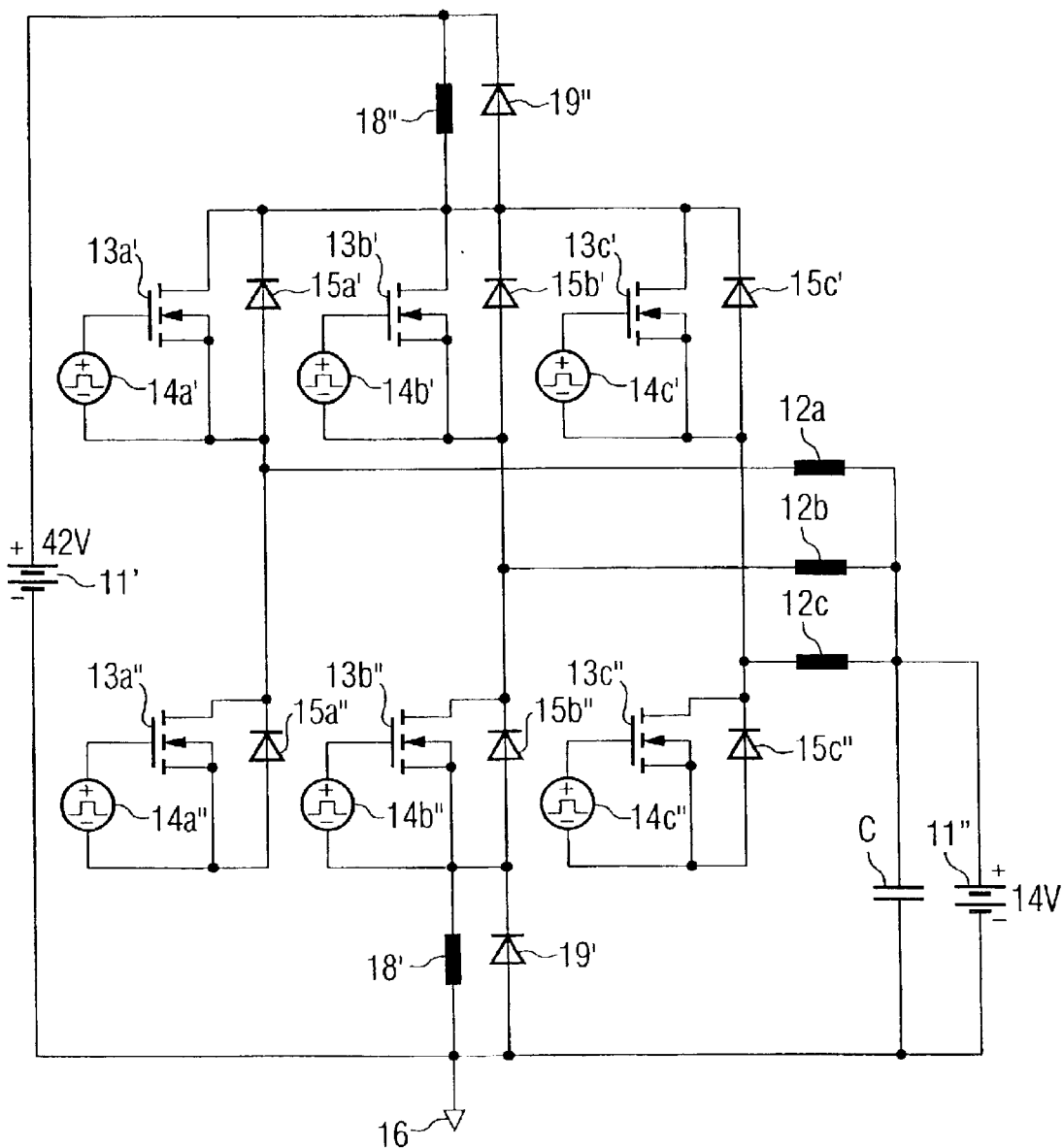
FIG. 4 shows a circuit arrangement in accordance with this present invention wherein, compared to the basic arrangement depicted in FIG. 2, a multiphase, bidirectional step-up/step-down regulator has been added.

FIG. 4 shows a circuit arrangement in accordance with this present invention wherein the basic circuit shown in FIG. 2 is expanded to include a multiphase, bidirectional step-up/step-down regulator. This Figure shows a DC/DC converter like those that are used in an integrated starter generator for transporting energy between the 42 V and the 14 V onboard power supply system of a motor vehicle. The reference numbers are the same as those used in the Figures described above, and (') and (") designate the forward and backward direction, respectively. For reasons of simplicity, the coils 12*a–c* are only shown as inductances. The capacitor C is used to ensure voltage stability. As shown in FIG. 4, depending on the direction of regulation, it is possible to place the commutation inductance 18', 18" resp. the network comprising a commutation inductance 18', 18" and a second diode 19', 19" in the ground path or the supply voltage feed line. Of course, this is also possible for unidirectional regulators, depending on the operating mode.

Please note that embodiments shown herein are solely intended to illustrate particularly advantageous embodiments of the circuit arrangement in accordance with this present invention. While remaining within the scope of this present disclosure, those in the art will be able to carry out a number of variations without departing from the spirit of this present invention.

The characteristics of this present invention that are disclosed in the above description, in the drawings as well as in the claims may be significant for the implementation of this present invention, both individually as well as in any desired combination thereof.

What is claimed is:

1. A circuit arrangement for switching an inductive load, comprising:
   connections to a power supply source for applying an exciter voltage to the inductive load in a switched-on state,
   switching means for opening and closing, depending on a control signal, a power circuit comprising the inductive load and the power supply source connections, wherein the circuit is closed when switched from the switched-off to the switched-on state and opened when switched from the switched-on to the switched-off state,
   a first diode connected in parallel with the inductive load and arranged to block in the switched-on state, and
   an additional commutation inductance arranged in parallel with the inductive load and in series with the first diode.

2. A circuit arrangement in accordance with claim 1, further comprising at least one other inductive loads connected in series with an individual associated switching means and an individual associated diode, and a commutation inductance connected in parallel with the inductive load and in series with the diode.

3. A circuit arrangement in accordance with claim 1, further comprising a second diode connected in parallel with the commutation inductance and arranged to block in the switched-on state.

4. A circuit arrangement in accordance with claim 1, wherein the commutation inductance or the network comprising a commutation inductance and second diode is provided on the ground side of the switching means.

5. A circuit arrangement in accordance with claim 1, wherein the commutation inductance or the network comprising a commutation inductance and a second diode is provided on the supply voltage-side of the switching means.

6. A circuit arrangement in accordance with claim 1, wherein the inductive loads are magnetic injection valves in a motor vehicle.

7. A circuit arrangement in accordance with claim 1, wherein the switching means comprise a switching transistor to which a control power source can apply a control voltage as a control signal.

8. A circuit arrangement in accordance with claim 1, wherein the switching transistor is a self-blocking MOSFET.

9. A circuit arrangement in accordance with claim 1, wherein several switching transistors are provided controlled by a joint control power source whose signal is distributed to several switching transistors via demultiplexing.

10. A method for switching an inductive load, comprising:
    providing an exciter voltage that can be applied to the inductive load in a switched-on state,
    switching, depending on a control signal, a power circuit comprising the inductive load and power supply source connections into either a switched-on state or a switched-off state,
    connecting a first diode in parallel with the inductive load and arranging it to block in the switched-on state, and
    providing an additional commutation inductance arranged in parallel with the inductive load and in series with the first diode.

11. A circuit arrangement in accordance with claim 10, wherein the inductive loads are magnetic injection valves in a motor vehicle.

12. A method in accordance with claim 10, further providing several inductive loads that are connected in series with individual associated switching means and individual associated diodes, and providing a commutation inductance which is connected in parallel with the inductive loads and in series with the diodes that are connected with each other in parallel.

13. A method in accordance with claim 10, further providing a second diode connected in parallel with the commutation inductance and arranged to block in the switched-on state.

14. A method in accordance with claim 10, providing the commutation inductance or a network comprising a commutation inductance and a second diode on the ground side of the switching means.

15. A method in accordance with claim 10, providing the commutation inductance or a network comprising a commutation inductance and a second diode on the supply voltage-side of the switching means.

16. A method in accordance with claim 10, wherein for switching several inductive loads, providing several switching transistors controlled by a joint control power source whose signal is distributed to several switching transistors via demultiplexing.

17. A method in accordance with claim 10, wherein the switching means comprises a switching transistor to which a control power source can apply a control voltage as a control signal.

18. A method in accordance with claim 10, wherein the switching transistor is a self-blocking MOS-FET.

19. A circuit arrangement for switching an inductive load, said arrangement comprising:

power supply connections to supply an exciter voltage to the load in a switched-on state, a switch to open and close, depending upon a control signal, a power circuit comprising the load and power supply connections, wherein the circuit is closed when switched from a switched-off state to the switched-on state and opened when switched from the switched-on state to the switched-off state, a first diode connected in parallel with the load and arranged to block in the switched-on state, a first commutation inductance arranged in parallel with the load and in series with the first diode, and second and third commutation inductances or two networks comprising a commutation inductance and a second diode, one arranged on the ground side and the other on the supply voltage-side of the switch.

20. A method for switching an inductive load, comprising:

applying an exciter voltage to the load in a switched-on state, switching, depending on a control signal, a power circuit comprising the load and power supply connections into either a switched-on state or a switched-off state, connecting a first diode in parallel with the inductive load and arranging it to block in the switched-on state, providing a first commutation inductance and arranging it in parallel with the load and in series with the first diode, and providing two additional commutation inductances or two networks comprising a commutation inductance and a second diode, wherein one is arranged on the ground side and the other is arranged on the supply-voltage side of the switch.

* * * * *